(12) United States Patent
Tseng

(10) Patent No.: US 6,258,682 B1
(45) Date of Patent: Jul. 10, 2001

(54) METHOD OF MAKING ULTRA SHALLOW JUNCTION MOSFET

(75) Inventor: Horng-Huei Tseng, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/691,276

(22) Filed: Oct. 17, 2000

(51) Int. Cl.⁷ .................................................. H01L 21/336
(52) U.S. Cl. ........................ 438/305; 438/592; 438/596
(58) Field of Search ..................................... 438/305, 306, 438/307, 592, 595, 596, 655, 656, 664

(56) References Cited

U.S. PATENT DOCUMENTS

| | | | |
|---|---|---|---|
| 5,858,849 | * | 1/1999 | Chen ..................................... 438/592 |
| 5,966,607 | * | 10/1999 | Chee et al. ............................ 438/592 |
| 6,100,191 | * | 8/2000 | Lin et al. ............................... 438/664 |

* cited by examiner

Primary Examiner—Chandra Chaudhari
(74) Attorney, Agent, or Firm—Blakely Sokoloff Taylor & Zafman LLP

(57) ABSTRACT

A method of fabricating ultra shallow junction MOSFET is disclosed. The method comprises following steps. First of all, a semiconductor substrate having gate region and source/drain regions defined are prepared. A IMP process is then performed to anisotropic deposit silicon layer on the top surfaces of the gate region, source/drain regions. No silicon layer is formed on the sidewall of the gate region. A LDD ion implant into IMP silicon layer is then performed. A thermal oxidation process is then performed to partially oxidize a portion of IMP silicon layer and the sidewall polysilicon of the polygate region to ensure the polygate region is isolated from the source/drain regions. Furthermore, the impurities will be driven into semiconductor substrate to form ultra-shallow junction. After that, a CVD insulating layer is formed on all areas. An anisotropic etching is then performed to form sidewall spacers and expose the remnant IMP silicon layer on both source/drain regions and gate region. Thereafter, a heavily doped ion implantation through IMP silicon layer into semiconductor substrate is carried out. A salicide process is then performed to form silicide layer on the source/drain regions and on the gate region and activate the conductive impurities to form deep junction.

8 Claims, 2 Drawing Sheets

METHOD OF MAKING ULTRA SHALLOW JUNCTION MOSFET

FIELD OF THE INVENTION

The present invention relates to a semiconductor process, and more particularly to a method of fabricating ultra shallow junction MOSFET.

BACKGROUND OF THE INVENTION

With the advent of the integrated circuit industry, the demand for device density increased becomes a trend. It is essentially to have extra-high density devices in a chip so as to achieve powerful commercial competitiveness. However, as a device scaled from one micron down to submicron or beyond, it may suffer more stringent problems. For examples, hot carriers effect and punchthrough effects are two of the major constraints in CMOS transistor scaling. Further, parasitic resistance and capacitance in the scaled device structure are required to avoid.

Other limiting factor for devices with submicron dimensions is the conductivity of the source/drain regions and the poly-gate. For example, the sheet resistance of diffusion regions increases from 25 $\Omega$/sq - in a 1 $\mu$m technology to 50 $\Omega$/sq - in a 0.5 Am technology. A self-aligned silicide technology, namely salicide, involving the formation of silicide on poly-gate, source and drain contact simultaneously. The salicide process can provide not only low-sheet resistance for S/D regions and for gate electrode in MOS devices but also a very clean suicide-silicon interface. Further, it does not require any additional lithography and etching. In addition, the alignment was predetermined.

However, the salicide process requires consuming a portion of silicon substrate while the silicide forming metal reacts with the semiconductor substrate. The silicidation process will countervail the ultra shallow junction formed for scale down devices. Hence, it is desired to have a silicon layer deposit on the source/drain regions for silicidation. To ensure the source/drain region isolate from gate region during CVD deposit silicon layer process, an oxide layer is usually formed before the layer deposited. The processes thus require complex process.

Thus an object of the present invention is to simplify the fabrication process.

SUMMARY OF THE INVENTION

The present invention discloses a method of fabricating ultrashallow junction MOSFET. The method comprises following steps. First of all, a semiconductor substrate having gate region and source/drain regions defined are prepared. An IMP process is then performed to anisotropic deposit silicon layer on the top surfaces of the gate region, source/drain regions. No silicon layer is formed on the sidewall of the gate region. A LDD ion implant into IMP silicon layer is then performed. A thermal oxidation process is then performed to partially oxidize a portion of IMP silicon layer and the sidewall polysilicon of the polygate region to ensure the polygate region is isolated from the source/drain regions. Furthermore, the impurities will be driven into semiconductor substrate to form ultra-shallow junction. After that, a CVD insulating layer is formed on all areas. An anisotropic etching is then performed to form sidewall spacers and expose the remnant IMP silicon layer on both source/drain regions and gate region. Thereafter, a heavily doped ion implantation through IMP silicon layer into semiconductor substrate is carried out. A refractory metal is then deposited on entire regions. After that, a first RTP step is performed to form silicide layer on the source/drain regions and on the gate region. Subsequently, the unreacted metal layer is removed. Another RTP step is then performed again to stabilize the silicide layer, activate the conductive impurities, and form deep junction.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
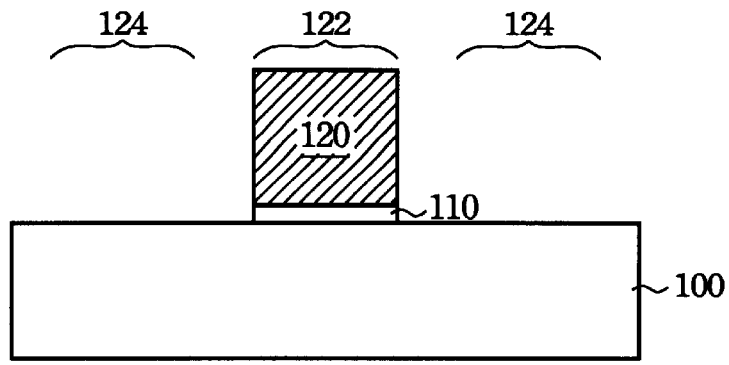
FIG. 1. is a cross-sectional view of forming gate region on a semiconductor substrate.

According to FIG. 1 of the present invention, a gate oxide layer 110 is grown by thermal oxidation the underlying substrate 100 to a thickness between about 50–300 Å.

A conductive material 120 such as a doped polysilicon layer is then formed on the gate oxide layer 110 by in-situ doping LPCVD process. Typically, the conductive layer 120 is about 1000 to about 3000 Å in thickness.

Still referring to FIG. 1, after a photoresist layer (not shown) coated on the conductive layer 120 to define a polygate region 122, an etching process is then implemented to etching exposed conductive layer 120, using gate oxide layer 110 as a stop layer. The photoresist is then stripped away. A wet dip is followed to remove the gate oxide layer 110 and to expose upper surface of the source/drain regions 124 of the semiconductor substrate 100.

Figure 2:
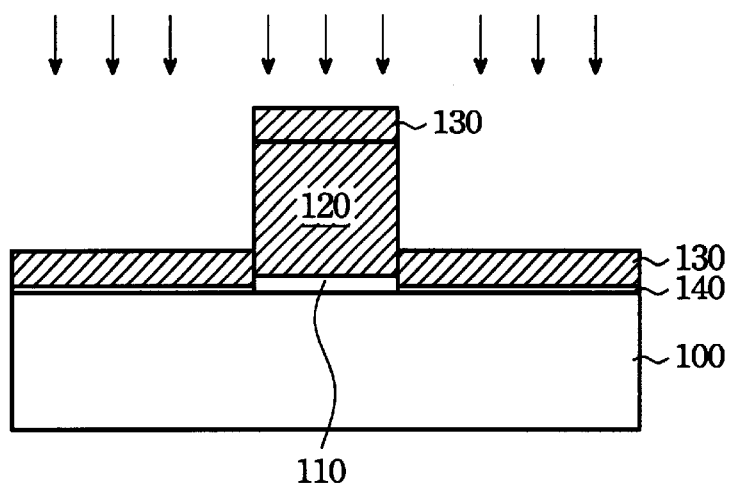
FIG. 2. is a cross-sectional view of forming IMP silicon layer on the gate region and source/drain regions and forming doping region according to the present invention;.

Thereafter, referring to FIG.2 an ion-metal plasma (IMP) process is then followed to directionally deposit an IMP silicon layer 130 on the polygate region 122 and on the source/drain regions 124. The IMP process, like a sputtering process, is to ionize a silicon material or a refractory material to silicon ions or metal ions, and then the ions are biased to directionally deposited on the top surface of the substrate. In the process, no silicon is deposited on sidewalls of the polygate region 122. The IMP silicon layer is for silicide contacts.

Subsequently, n-type, or p-type conductive ions are implanted (as indicated by arrows) into the conductive layer 120, an IMP silicon layer to form doping layer 140. In a preferred embodiment, the n-type ions can be phosphorus or arsenic ions, and the p-type ions can be BF2+or boron. The conductive impurities are selected in accordance with n-MOSFET or p-MOSFET made. The implantation energy and dosage be used in the implantation are between about 1 to 30 keV and 1E13 to5E15/cm$^2$, respectively.

Figure 3:
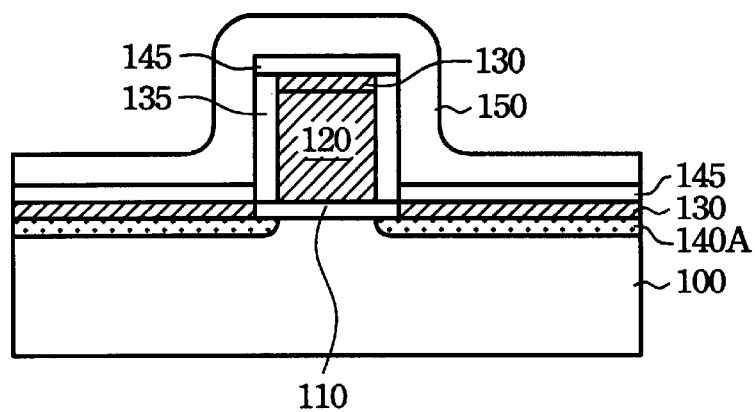
FIG. 3. is a cross-sectional view of forming polyoxide, IMP oxide, and then forming an insulating layer on all areas according to the present invention.

Referring to FIG. 3, a thermal oxidation process at a temperature between about 650–900° C. is carried out. The oxidation process is to form a polyoxide layer 135 on sidewalls of the polygate region 122 and IMP oxide layers 145 on the source/drain regions 124 and on the top surface of the polygate region 122 by oxidizing a portion of the polysilicon layer and a portion of the IMP silicon layer. The step is to ensure the polygate region 122 is separated from the source/drain regions 124. The IMP silicon layer 130 is only partially oxidized so that a portion of remnant IMP silicon layer 130 is for contact formation. In the process, the doping impurities in the doped layer 140 will serve as a diffusion source, and be driven into the semiconductor substrate 100 to form ultra-shallow junction 140A for LDD. An insulating layer 150 such as oxide layer is deposited on entire areas by PECVD process. The insulating layer 150 is a silicon dioxide layer or a silicon nitride layer.

Figure 4:
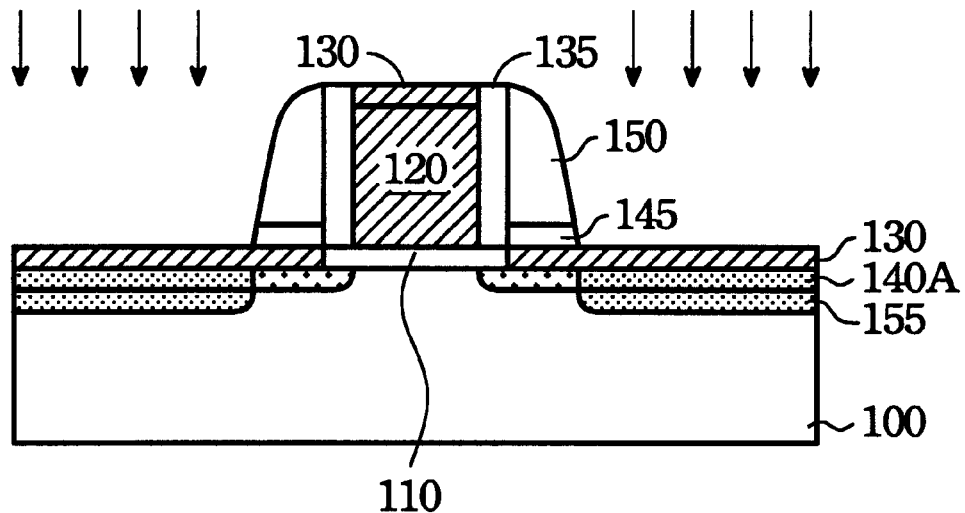
FIG. 4. is a cross-sectional view of performing an anisotropic etching to form sidewall spacers and to expose remnant IMP silicon layer, and then performing source/drain region implantation according to the present invention.

Turning to FIG.4, The insulating layer 150 is then etched by an anisotropic etching process to form sidewall spacers 150 using the etching selectively stops on the IMP silicon layer 130. Typically, the insulating sidewall spacers 150 are between about 1000–2500 Å thick. Thereafter, a heavily ion implantation through remnant IMP silicon layer 130 into semiconductor substrate 100 is carried out. The doping regions 155 are mainly for source/drain regions. Preferably, the implantation energy and doses are, respectively, between about 20 keV to 60 keV and $5\times10^{14}$ /cm$^2$–$1\times10^6$ /cm$^2$.

Figure 5:
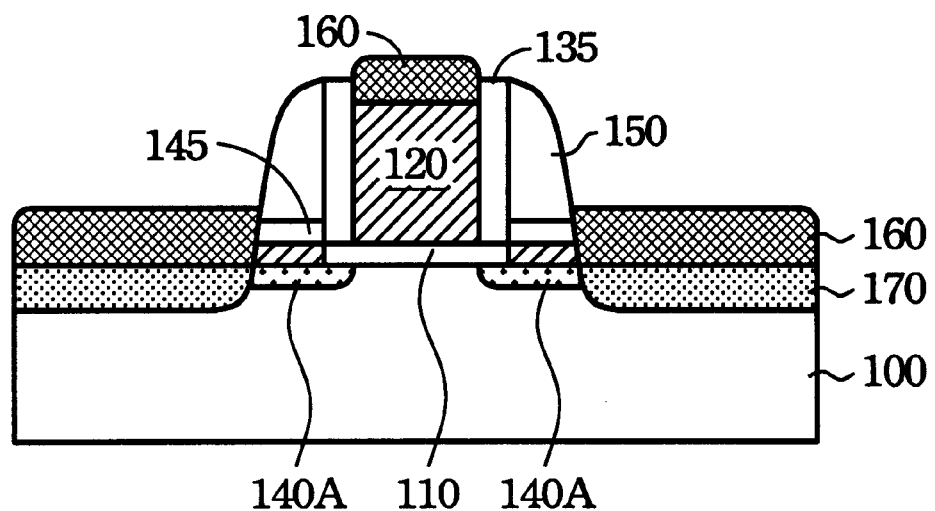
FIG. 5. is a cross-sectional view of performing salicide process according to the present invention.

Please refer to FIG. 5, a silicide forming metal such as tungsten, titanium, cobalt or nickel is then deposited by CVD or sputtering process on the exposed IMP silicon layer 130. After first step of rapid thermal process (RTP anneal), the metal reacts with the underlying IMP silicon layer to form the metal silicide layer 160. The removal of the unreacted metal layers on the sidewall spacer 150 is then carried out by a wet etching using a solution containing NH$_4$OH, H$_2$O and H$_2$O$_2$. A second RTP step is then performed to stabilized the silicide layer and active the doping impurities and to form deep junction 170.

While the preferred embodiment of the invention has been illustrated and described, it will be appreciated that various changes can be made therein without departing from the spirit and scope of the invention.

What is claim is:

1. A method of making ultra shallow junction MOSFET, said method comprising the steps of:

providing a semiconductor substrate having source/drain regions and poly-gate region formed thereon;

depositing an IMP silicon layer on said source/drain regions and a polysilicon layer on said polygate region using ion-metal plasma directional;

performing a first ion implantation to entire areas;

performing a thermal oxidation process to form an IMP oxide layer on said source/drain regions and said polysilicon layer by partially oxidizing said IMP silicon layer, said polysilicon layer;

forming a dielectric layer on entire areas;

performing an anisotropic etching so as to form sidewall spacers on said poly-gate and to do IMP oxide layer removal;

performing a second ion implantation through said IMP silicon into said source/drain regions;

forming metal layer on entire areas;

performing a thermal annealing process so as to form a metal silicide layer on surfaces of said source/drain regions and said polygate region; and removing unreactive metal layer.

2. The method of claim 1, wherein said IMP silicon layer is between about 1000–3000 Å.

3. The method of claim 1, wherein said step of performing a thermal oxidation process is done at a temperature between about 650–900° C.

4. The method of claim 1, wherein said dielectric layer is selected from silicon dioxide layer or nitride layer.

5. The method of claim 1, wherein said step of first ion implantation is implanted by using an energy and a dosage of about 1–30 keV and of about $1\times10^{13}$–$5\times10^5$/cm$^2$, respectively.

6. The method of claim 1, wherein said step of second ion implantation is implanted by using an energy and a dosage of about 20–60 keV and of about $5\times10^{14}$–$1\times10^{16}$/cm$^2$, respectively.

7. The method of claim 1, wherein said metal layer is selected from the group consisting of tungsten, titanium, cobalt and nickel.

8. The method of claim 1, further comprising another RTP process to stabilize said metal silicide after step of removing unreactive metal layer.

* * * * *